US009053757B2

(12) United States Patent
Fujioka

(10) Patent No.: US 9,053,757 B2
(45) Date of Patent: Jun. 9, 2015

(54) SEMICONDUCTOR MEMORY DEVICE COMPRISING A PLURITY OF INPUT/OUTPUT PORTS AND A PLURITY OF MEMORY BLOCKS CORRESPONDING TO THE PLURALITY OF INPUT/OUTPUT PORTS

(71) Applicant: FUJITSU SEMICONDUCTOR LIMITED, Yokohama-shi, Kanagawa (JP)

(72) Inventor: Shinya Fujioka, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/024,016

(22) Filed: Sep. 11, 2013

(65) Prior Publication Data
US 2014/0169071 A1 Jun. 19, 2014

(30) Foreign Application Priority Data

Oct. 3, 2012 (JP) ................................ 2012-221056

(51) Int. Cl.
G11C 8/00 (2006.01)
G11C 7/02 (2006.01)
G11C 11/406 (2006.01)
(52) U.S. Cl.
CPC ............ G11C 7/02 (2013.01); G11C 11/40603 (2013.01); G11C 11/40618 (2013.01)
(58) Field of Classification Search
USPC .............................. 365/194, 205, 230.03, 149
See application file for complete search history.

(56) References Cited

U.S. PATENT DOCUMENTS

| 2002/0078311 | A1 | 6/2002 | Matsuzaki et al. |
| 2003/0026155 | A1 | 2/2003 | Yamagata |
| 2007/0022245 | A1 | 1/2007 | Sohn et al. |
| 2011/0047311 | A1 | 2/2011 | Skinner et al. |
| 2012/0263003 | A1* | 10/2012 | Sakakibara et al. .......... 365/222 |

FOREIGN PATENT DOCUMENTS

| JP | 2006-164323 A | 6/2006 |
| JP | 2006-251876 A | 9/2006 |
| JP | 2007-108996 A | 4/2007 |
| JP | 2003-45179 A | 2/2013 |
| KR | 10-2002-0050092 A | 6/2002 |

OTHER PUBLICATIONS

Korean Office Action, dated Dec. 16, 2014, issued in corresponding Korean Patent Application No. 10-2013-0116119.

* cited by examiner

Primary Examiner — Hoai V Ho
(74) Attorney, Agent, or Firm — Arent Fox LLP

(57) ABSTRACT

A semiconductor memory device including a plurality of memory blocks each including a first command generating circuit which generates a first command; a control circuit which controls the memory core based on the first command or based on a second command inputted via the input/output port; and an arbitration circuit which outputs a first delay signal to the control circuit of one memory block of the plurality of memory blocks, the first delay signal which delays a start of an execution of the first command, in a first case when the first command generated by the first command generating circuit of the one memory block and the second command inputted via the input/output port of another memory block of the plurality of memory blocks are overlapped.

7 Claims, 12 Drawing Sheets

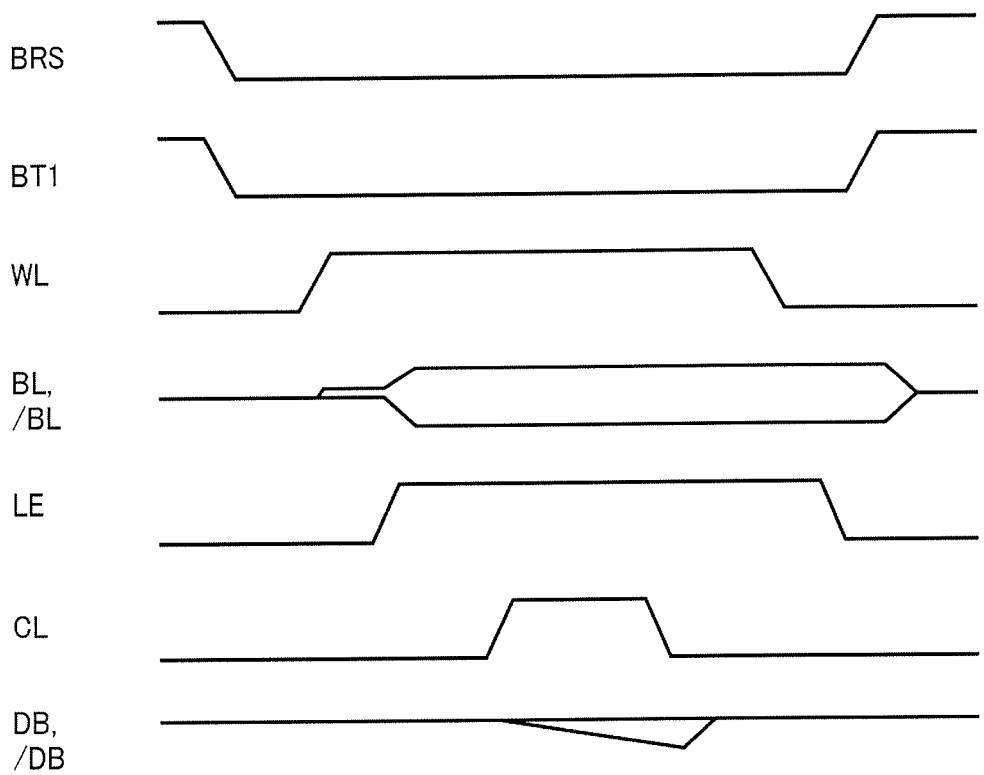

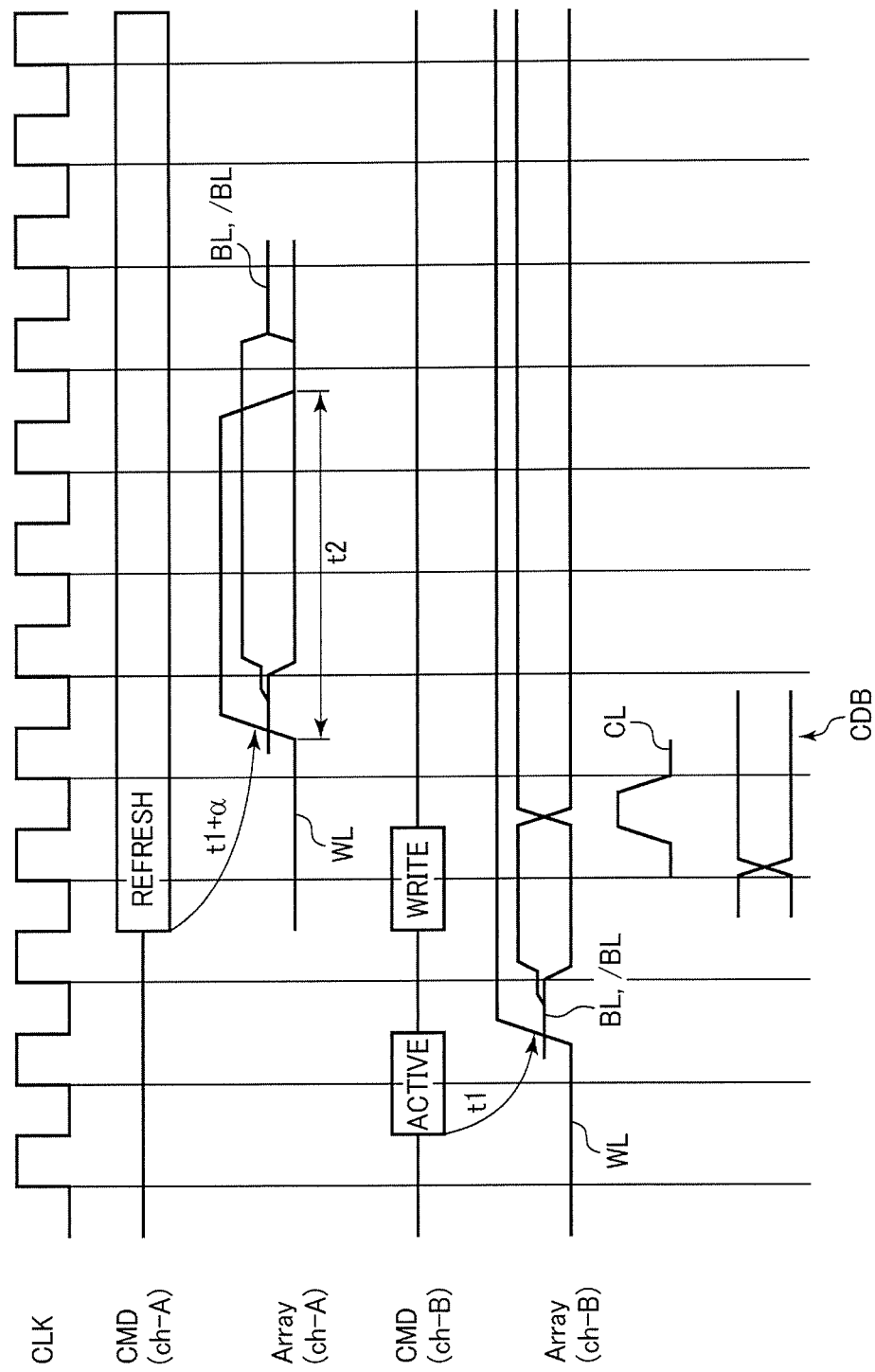

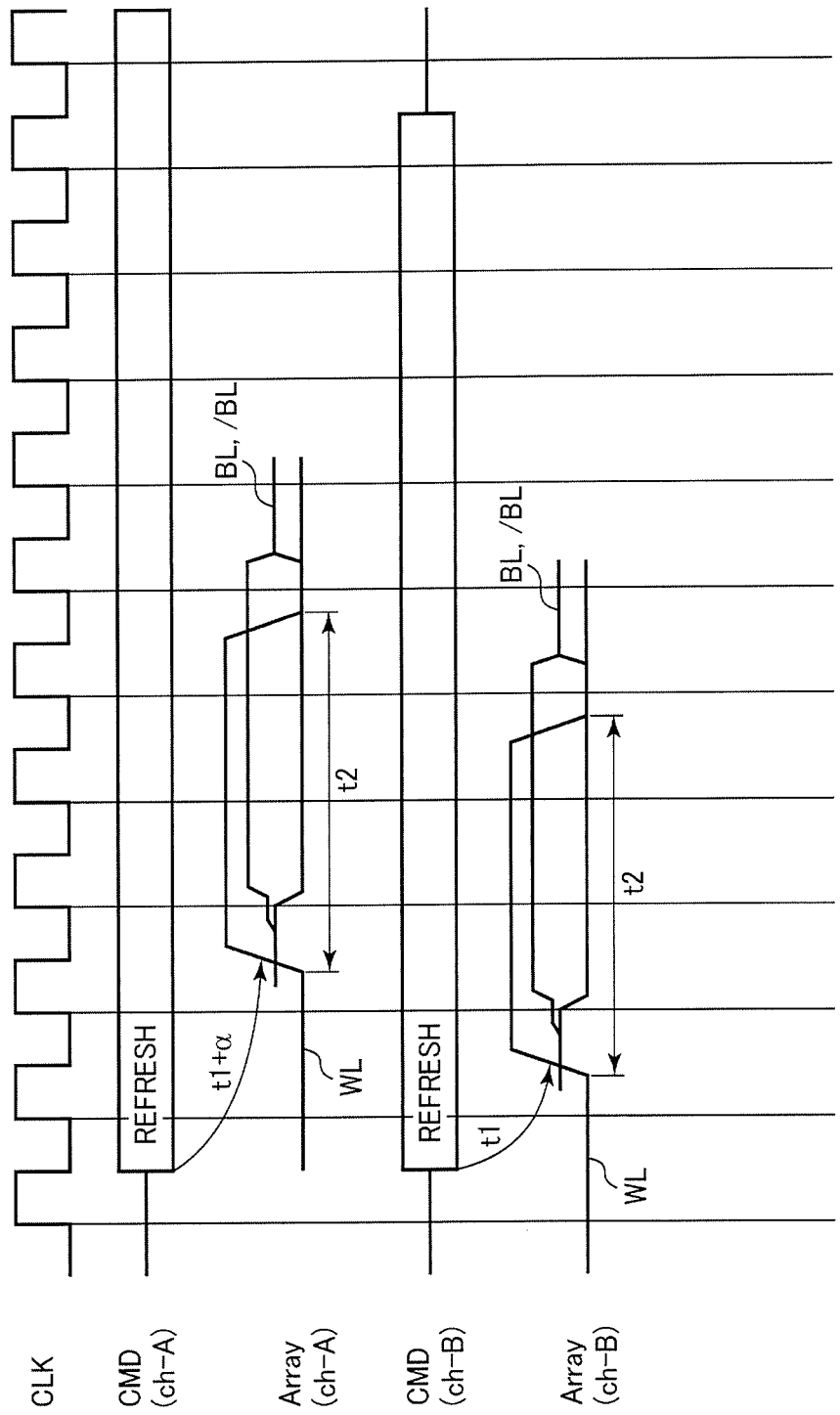

SEMICONDUCTOR MEMORY DEVICE COMPRISING A PLURALITY OF INPUT/OUTPUT PORTS AND A PLURALITY OF MEMORY BLOCKS CORRESPONDING TO THE PLURALITY OF INPUT/OUTPUT PORTS

CROSS-REFERENCE TO RELATED APPLICATION

This application is based upon and claims the benefit of priority of the prior Japanese Patent Application No. 2012-221056, filed on Oct. 3, 2012, the entire contents of which are incorporated herein by reference.

FIELD

The embodiments discussed herein are related to a semiconductor memory device.

BACKGROUND

Recently it is proposed to mount a plurality of memory chips of the same specifications in one package and use the plural memory chips respectively for a plurality of channels.

This technique can realize high integration, downsizing, etc.

Related references are as follows:
Japanese Laid-open Patent Publication No. 2006-251876;
Japanese Laid-open Patent Publication No. 2006-164323;
Japanese Laid-open Patent Publication No. 2003-45179; and
Japanese Laid-open Patent Publication No. 2007-108996.

SUMMARY

According to aspects of an embodiment, a semiconductor memory device including: a plurality of input/output, ports; a plurality of memory blocks provided respectively corresponding to the plurality of input/output ports, the plurality of memory blocks each comprising a memory core having a memory cell array including a plurality of memory cells; a first command generating circuit which generates a first command; and a control circuit which controls the memory core based on the first command or based on a second command inputted via the input/output port; and an arbitration circuit which outputs a first delay signal to the control circuit of one memory block of the plurality of memory blocks, the first delay signal which delays a start of an execution of the first command, in a first case when the first command generated by the first command generating circuit of the one memory block and the second command inputted via the input/output port of another memory block of the plurality of memory blocks are overlapped.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 5 is a time chart of an operational sequence of a sense amplifier;
FIG. 11 is a time chart of a case that the refresh command and a write command are overlapped;
and
FIG. 12 is a time chart of a case that the refresh commands are overlapped each other.

DESCRIPTION OF EMBODIMENTS

Mounting memories for a plurality of channels in one package does not always ensure sufficient operational reliability.

In a semiconductor memory device having memories for a plurality of channels mounted, there is a risk that the refresh operations in the plural channels may overlap. Because of large peak currents flowing in the refresh operations, the current capacity may lack, and the semiconductor memory device may not normally operate.

It is an idea here to increase the power source capacity, but it increases the size of the device as a whole, which impairs the significance of mounting memories for a plurality of channels on one chip.

Also, when a refresh operation is made in one channel, and in another channel, micro-signals are processed, there is a risk that noises caused by the peak current of the refresh operation may affect the micro-signals, which may cause erroneous operations.

[a] An Embodiment

Figure 1:
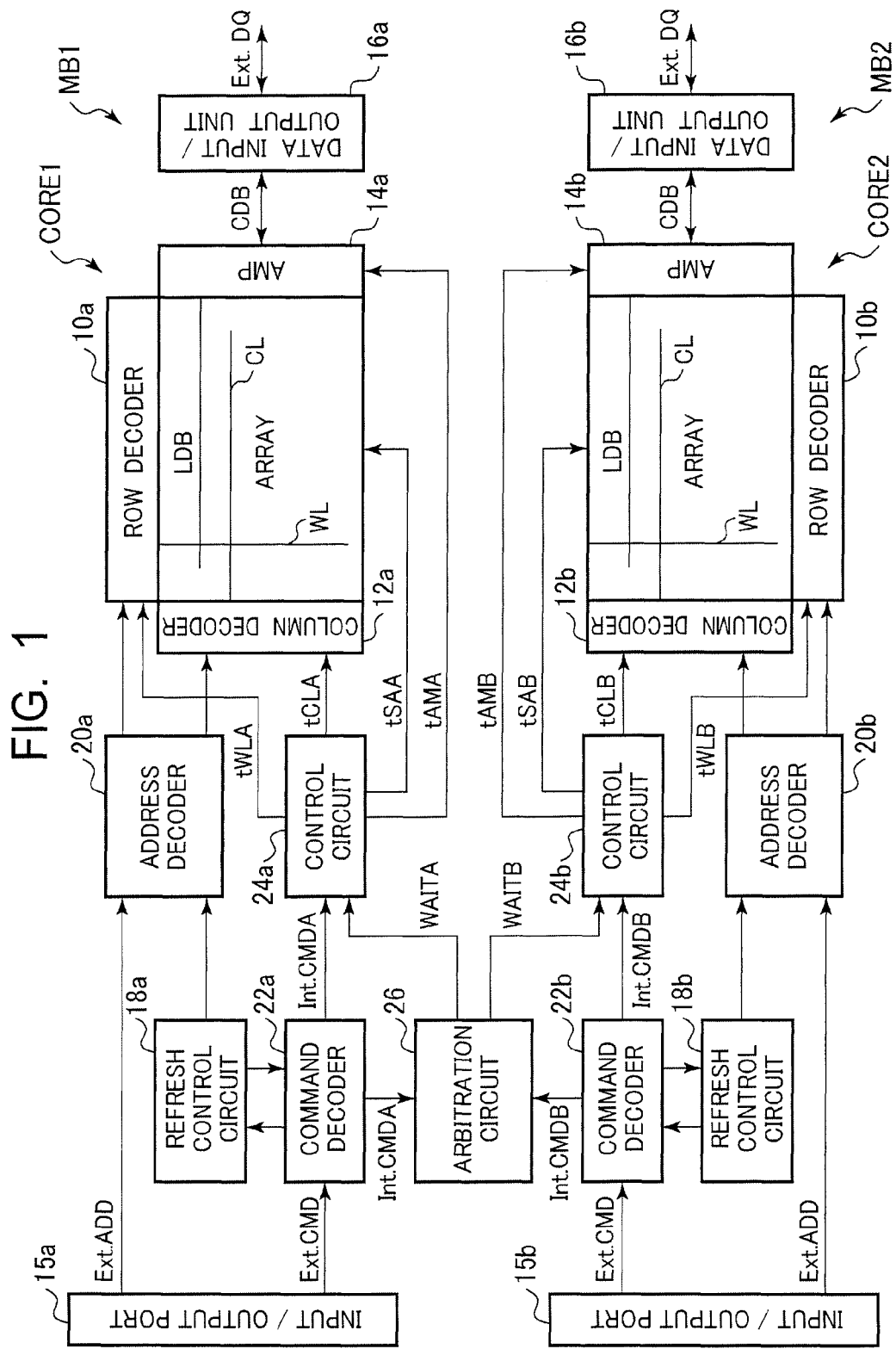
FIG. 1 is a block diagram of a semiconductor memory device according to an embodiment.

The semiconductor memory device according to an embodiment will be described with reference to FIGS. 1 to 12. FIG. 1 is the block diagram of the semiconductor memory device according to the present embodiment.

The semiconductor memory device according to the present embodiment includes a plurality of memory blocks MB1, MB2. To simplify the description, two memory blocks MB1, MB2 are illustrated. The memory block MB1 is for Channel A, and the memory block MB2 is for Channel B.

The plural memory blocks MB1, MB2 are provided respectively corresponding to a plurality of input/output ports 15a, 15b. To simplify the description, 2 input/output ports 15a, 15b are illustrated in FIG. 1. The input/output port 15a is for Channel A, and the input/output port 15b is for Channel B.

For example, the input/output, ports 15a, 15b are connected respectively to different buses in a system, and to the respective input/output ports 15a, 15b, read commands and write commands are inputted from different CPUs.

Figure 4:
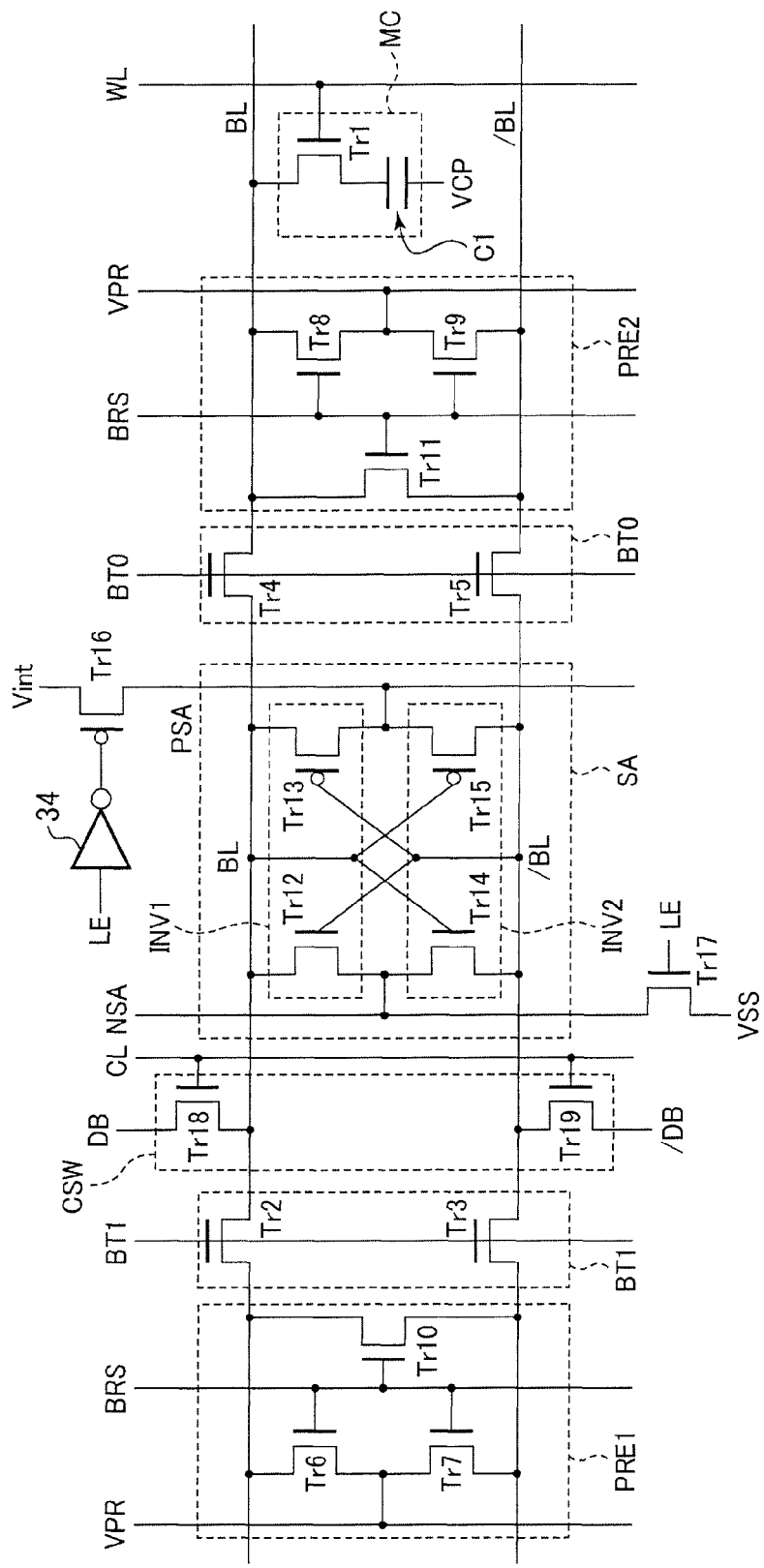
FIG. 4 is a circuit diagram including a sense amplifier and a memory cell.

The respective memory blocks MB1, MB2 comprise memory cores CORE1, CORE2 respectively including memory cell arrays (ARRAY) 28 (see FIG. 2) having a plurality of memory cells MC (see FIG. 4).

The semiconductor memory device according to the present embodiment is, e.g., a DRAM (Dynamic Random Access Memory). The memory cells MC provided in the memory cores CORE1, CORE2 are dynamic memory cells. Such memory cells MC each include one transistor (transfer transistor) Tr1 (see FIG. 4) and one capacitor C1 (see FIG. 4). The memory cell MC stores data by the presence or absence of a storage of a charge in the capacitor C1. For example, the charged state of the capacitor C1 corresponds to Data "1", and the discharged state of the capacitor C1 corresponds to Data "0".

In the dynamic memory cell MC, a charge stored in the capacitor C1 decreases as time passes. Thus, the refresh, which is the operation of restoring the memory cell MC to the proper state, is periodically made.

In the respective memory cores CORE1, CORE2, row decoders 10a, 10b which drive word lines WL are respectively provided. In the respective memory cores CORE1, CORE2, a plurality of the word lines WL are provided, but in FIG. 1, one of the plural word lines WL is schematically illustrated in each memory core CORE1, CORE2.

In the respective memory cores CORE1, CORE2, column decoders 12a, 12b which drive column gate lines (column switch signal lines) CL are provided. In the respective memory cores CORE1, CORE2, a plurality of column gate lines CL are provided, but in FIG. 1, one of the plural column gate lines CL is schematically illustrated in each memory core CORE1, CORE2.

In the respective memory cores CORE1, CORE2, amplifiers (read/write amplifiers, AMP) 14a, 14b connected to local data bus lines (data bus lines, data lines) LDB are provided. The local data bus lines LDB are represented also by "DB", "/DB". In the respective memory cores CORE1, CORE2, a plurality of local data bus lines LDB are provided, but in FIG. 1, one of the plural local data bus lines LDB is schematically illustrated in each memory core CORE1, CORE2.

The amplifiers 14a, 14b of the respective memory cores CORE1. CORE2 are connected respectively to data input/output unit (DQ control units) 16a, 16b. The amplifiers 14a, 14b and the data input/output units 16a, 16b are connected respectively by common data buses CDB. Input/output data (Ext. DQ) are inputted/outputted via the data input/output units 16a, 16b.

In FIG. 1, the data input/output units 16a, 16b are illustrated independent of the input/output ports 15a, 15b, but actually the data input/output units 16a, 16b are parts of the input/output ports 15a, 15b.

In the respective memory blocks MB1, MB2, refresh control circuits 18a, 18b, address decoders 20a 20b, command decoders 22a, 22b and control circuits 24a, 24b are further provided.

The refresh control circuits (refresh command generating circuits) 18a, 18b generate refresh commands (REFRESH). The refresh contains auto-refresh and self-refresh, etc., but here to simplify the description, the generic term "refresh" is used. The refresh circuits 18a, 18b output refresh commands to the command decoders 22a, 22b and output to the address decoders 20a, 20b address signals indicating addresses of memory cells MC to be refreshed.

When the refresh control circuit 18a of Channel A generates a refresh command, it outputs a signal prefaz of H level (High level) indicating the refresh command to the command decoder 22a.

When the refresh control circuit 18b of Channel B generates a refresh command, it outputs a signal prefbz of H level indicating the refresh command to the command decoder 22b.

The address decoders 20a, 20b output to the row decoders 10a, 10b and the column decoders 12a, 12b decode signals generated based on the address signals from the address signals (Ext. ADD) from the outside or the address signals from the refresh control circuits 18a, 18b. The address signal (Ext. ADD) from the outside is inputted to the address decoder 20a of Channel A via the input/output port 15a of Channel A. The address signal (Ext. ADD) from the outside is inputted to the address decoder 20b of Channel B via the input/output port 15b of Channel B.

The command decoder 22a generates an interior command (Int. CMDA) based on a refresh command from the refresh control circuit lea and an external command (Ext. CMD) inputted from the outside. The external command (Ext. CMD) is inputted to the command decoder 22a of Channel A via the input/output port 15a of Channel A.

The command decoder 22b generates an interior command (Int. CMDB) based on a refresh command from the refresh control circuit 18b and an external command (Ext. CMD) inputted from the outside. The external command (Ext. CMD) is inputted to the command decoder 22b of Channel B via the input/output port 15b of Channel B.

The interior command (Int. CMDA, Int. CMDB) generated respectively by the command decoders 22a, 22b are inputted to the control circuits (timing control circuits) 24a, 24b and an arbitration circuit 26.

The external command (Ext. CMD) includes an active command (act), a read command (rd), a write command (wr), a precharge command (prt), etc.

The internal commands (Int. CMDA, Int. CMDB) include an internal command based on an external command (Ext. CMD), and an internal command based on a refresh command.

When an active command is inputted from the outside, the command decoder 22a outputs a signal (command) actaz indicating the active command to the arbitration circuit 26 and the control circuit 24a.

When a read command is inputted from the outside, the command decoder 22a outputs a signal (command) rdaz indicating the read command to the arbitration circuit 26 and the control circuit 24a.

When a write command is inputted from the outside, the command decoder 22a outputs a signal (command) wraz indicating the write command to the arbitration circuit 26 and the control circuit 24a.

When a precharge command is inputted from the outside, the command decoder 22a outputs a signal (command) prtaz indicating the precharge command to the arbitration circuit 26 and the control circuit 24.

When a refresh command is inputted, the command decoder 22a outputs a signal (command) refaz indicating the refresh command to the arbitration circuit 26 and the control circuit 24a.

When an active command is inputted from the outside, the command decoder 22b outputs a signal (command) actbz indicating the active command to the arbitration circuit 26 and the control circuit 24b.

When a read command is inputted from the outside, the command decoder 22b outputs a signal (command) rdbz indicating the read command to the arbitration circuit 26 and the control circuit 24b.

When a write command is inputted from the outside, the command decoder 22b outputs a signal (command) wrbz indicating the write command to the arbitration circuit 26 and the control circuit 24b.

When a precharge command is inputted from the outside, the command decoder 22b outputs a signal (command) prtbz indicating the precharge command to the arbitration circuit 26 and the control circuit 24b.

When the refresh command is inputted, the command decoder 22b outputs a signal (command) refbz indicating the refresh command to the arbitration circuit 26 and the control circuit 24b.

The control circuit (timing control circuit, timing circuit) 24a of Channel A outputs to the memory core CORE1 a control signal tWLA, tCLA, tSAA, tAMA based on an internal command Int. CMDA.

The control circuit (timing control circuit, timing circuit) 24b of Channel B outputs to the memory core CORE2 a control signal tWLB, tCLB, tSAB, tAMB, based on an internal command Int. CMDB.

The control signals tWLA, tWLB respectively control the row decoders 10a, 10b to select word lines WL and are inputted respectively to the row decoders 10a. 10b provided in the respective memory cores, CORE1, CORE2.

The control signals tCLA, tCLB respectively control the column decoders 12a, 12b to select column gate lines CL and are respectively inputted to the column decoders 12a, 12b provided in the respective memory cores CORE1, CORE2.

The control signals tSAA, tSAB respectively activate the sense amplifiers 30 (see FIG. 2) and are respectively inputted to the sense amplifiers 30 provided in the respective memory cores CORE1, CORE2.

The control signals tAMA, tAMB respectively activate the amplifiers 14a, 14b and are respectively inputted to the amplifiers 14a, 14b provided in the respective memory cores CORE1, CORE2.

When commands simultaneously coincide in a plurality of the channels, the arbitration circuit 26 delays, as required, the start of the execution of one of the commands. For example, when a refresh command in one of the channels and an active command in the other channel coincide, the arbitration circuit 26 outputs a signal (delay signal, delay command) waitA, waitB for delaying the start of the execution of, e.g., the refresh to either of the control circuits 24a, 24b. When a refresh command in one channel and a refresh command in the other channel coincide, the arbitration circuit 26 outputs a signal waitA, waitB for delaying the start of the execution of the refresh in either channel to either of the control circuits 24a, 24b.

Figure 2:
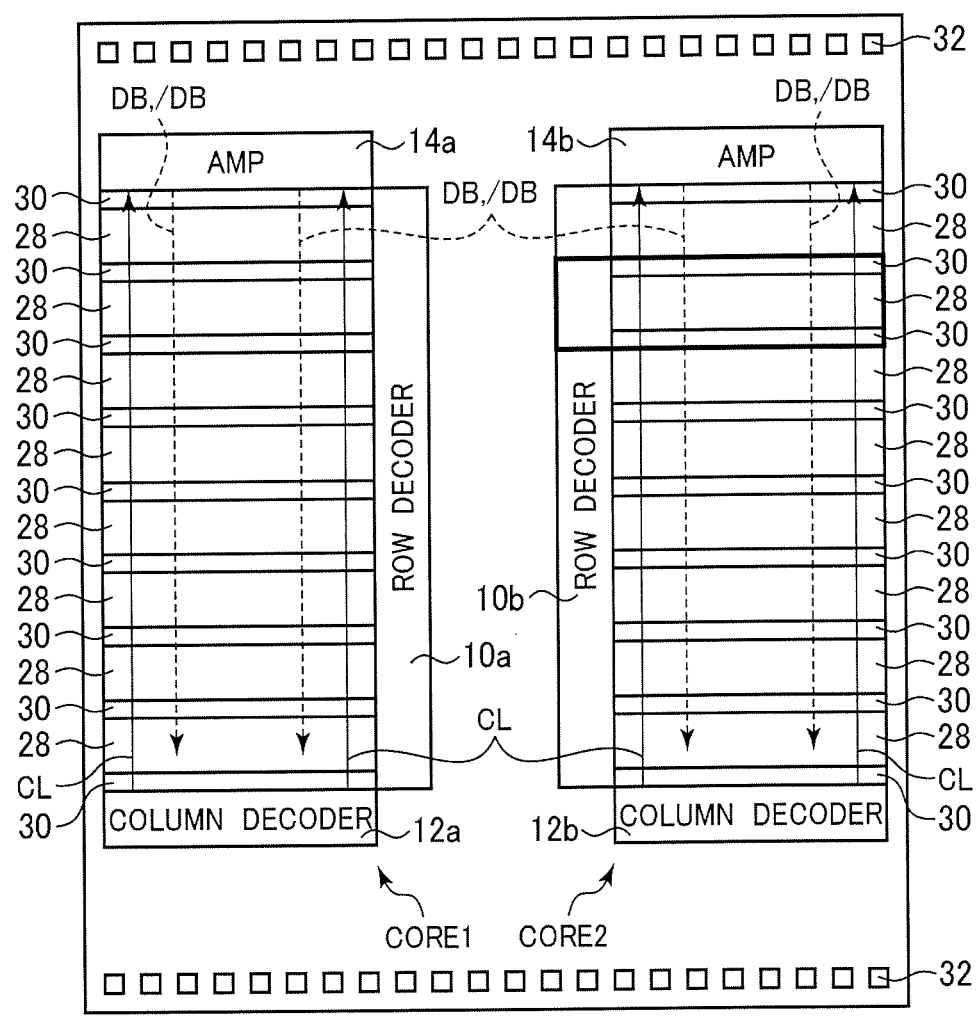
FIG. 2 is a plan view of an example of a layout of the semiconductor memory device according to the embodiment.

FIG. 2 is a plan view of an example of the layout of the semiconductor memory device according to the present embodiment.

As illustrated in FIG. 2, a plurality of memory cores CORE1, CORE2 are provided. Two memory cores CORE1, CORE2 are illustrated here.

In the respective memory cores CORE1, CORE2, a plurality of memory arrays 28 are provided. Eight memory arrays 28, for examples, are provided in the respective memory cores CORE1, CORE2 here.

On both sides of each memory cell array 28, the sense amplifiers 30 are respectively provided. A plurality of the sense amplifiers 30 are provided corresponding to the respective it lines BL, /BL, but in FIG. 2, the layout of the sense amplifiers 30 are schematically illustrated.

To the column decoders 12a, 12b, a plurality of column gate lines CL are connected. In FIG. 2, the column gate lines CL are schematically illustrated.

To the amplifiers 14a, 14b, a plurality of data bus lines DB, /DB are connected. In FIG. 2, the data bus lines DE, /DB are schematically illustrated.

At the periphery of the semiconductor substrate, a plurality of electrode pads 32 are arranged.

Figure 3:
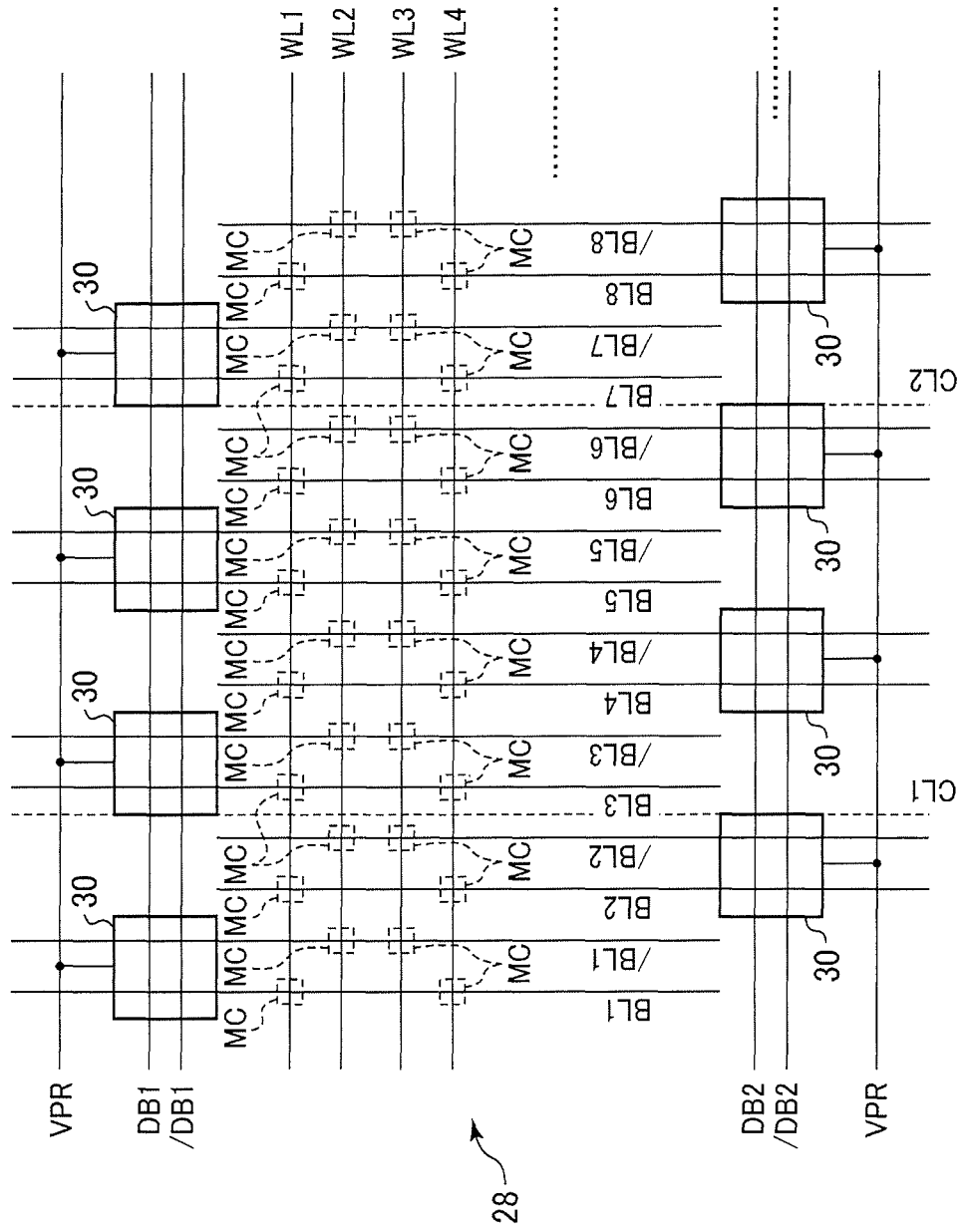
FIG. 3 is a circuit diagram corresponding to a part surrounded by a thick solid line in FIG. 2.

FIG. 3 is the circuit diagram of the part surrounded by the thick solid line in FIG. 2.

As illustrated in FIG. 3, a plurality of the word lines are provided. In FIG. 3, of the plural word lines WL, four word lines WL1-WL4 are illustrated. These plural word lines WL are connected to the row decoder 10b. The row decoder 10b sets the potential of the word lines WL H level to activate the word lines WL.

The bit lines BL, /BL are provided, intersecting the word lines WL. In FIG. 3, eight sets of the bit lines BL1-BL8, /BL1-/BL8 of the plural bit lines are illustrated.

In FIG. 3, the rectangles illustrated by the broken lines at the intersections between the word lines WL and the bit lines BL schematically illustrates that the memory cells MC are provided.

The plural sense amplifiers 30, which are arranged on both sides of the memory cell arrays 28, are shared between the memory cell arrays 28 on both sides of the respective sense amplifiers 30. The sense amplifiers 30 can be connected to the bit lines BL, /BL on either side by connection switches BT which will be described later.

FIG. 4 is the circuit diagram including the sense amplifier and the memory cell.

In FIG. 4, the data lines connected to the bit lines BL, /BL via the connection switches (BT0, BT1) are also called the bit lines BL, /BL.

The memory cell MC is formed of a capacitor C1 and a transistor (transfer transistor) Tr1. The transfer transistor Tr1 is formed of, e.g., an NMOS transistor. The capacitor C1 has one terminal connected to a cell plate voltage line VCP and the other terminal connected to one of the source/drain of the transfer transistor Tr1. The other of the source/drain of the transfer transistor Tr1 is connected to the bit line BL.

The gate of the transfer transistor Tr1 is connected to the word line WL. The potential of the word line WL is set H level to thereby select said word line WL, turn ON the transfer transistor Tr1 connected to said word line WL, and select the memory cell MC including said transfer transistor Tr1.

The connection switches BT0, BT1 are each formed by NMOS transistors Tr2-Tr5. One of the sources/drains of the NMOS transistors Tr2-Tr5 are respectively connected to the hit lines BL, /BL. The other of the sources/drains of the NMOS transistors Tr2-Tr5 are connected to the sense amplifier SA.

To the gates of the connection switches BT0, BT1, switch control signal lines BT0, BT1 are respectively connected. When the potential of the switch control signal line BT0 is H level, the NMOS transistors Tr4, Tr5 are turned ON, and the bit lines BL, /BL positioned on the right side of the drawing of FIG. 4 are connected to the sense amplifier SA via the switch BT0. When the potential of the switch control signal line BT0 is L level (Low level), the NMOS transistors Tr4, Tr5 are tuned OFF, and the bit lines BL, /BL positioned on the right side of the drawing of FIG. 4 are electrically disconnected from the sense amplifier SA.

When the potential of the switch control signal line BT1 is H level, the NMOS transistors Tr2, Tr3 are turned ON, and the bit lines BL, /BL positioned on the left side of the drawing of FIG. 4 are connected to the sense amplifier SA via the connection switch BT1. When the potential of the switch control signal line BT1 is L level, the NMOS transistors Tr2, Tr3 are turned OFF, and the bit lines BL, /BL positioned on the left side of the drawing of FIG. 4 are electrically disconnected from the sense amplifier SA.

The precharge circuits PRE1, PRE2 respectively include pairs of NMOS transistors Tr6-Tr9 which respectively connect the complementary bit lines BL, /BL to precharge voltage lines VPR. The precharge circuits PRE1, PRE2 respectively include NMOS transistors Tr10, Tr11 for connecting the bit lines BL, /BL to each other.

The gates of the NMOS transistors Tr6-Tr11 of the precharge circuits PRE1, PRE2 are connected to the precharge control signal lines ERS. When the potential of the precharge control signal lines SRS is H level, the bit lines BL, /BL are clamped while the potential of the bit lines BL, /BL becomes a precharge voltage VPR.

The sense amplifier SA is formed by a flip-flop circuit including a pair of CMOS inverters INV1, INV2 having the inputs and the outputs connected to each other. The inputs (the transistors Tr12-Tr15) of the respective CMOS inverters INV1, INV2 are connected to the bit lines BL, /BL. The respective CMOS inverters INV1, INV2 are respectively formed by NMOS transistors Tr12, Tr14 and PMOS transistors Tr13, Tr15 which are arranged in horizontal direction as viewed in FIG. 4. The sources of the PMOS transistors Tr13, Tr15 of the respective CMOS inverters INV1, INV2 are connected to a sense amplifier activating signal line PSA. The sources of the NMOS transistors Tr12, Tr14 of the respective CMOS inverters INV1, INV2 are connected to a sense amplifier activation signal line NSA.

A latch enabling signal line LE is connected to the input terminal of an inverter 34. The output terminal of the inverter 34 is connected to the gate of a PMOS transistor Tr16. The source of the PMOS transistor Tr16 is connected to a power source voltage Vint. The drain of the PMOS transistor Tr16 is connected to the sense amplifier activating signal line PSA.

The latch enabling signal line LE is connected to the gate of an NMOS transistors Tr17. The source of the NMOS transistor Tr17 is connected to a ground potential VSS. The drain of the NMOS transistor Tr17 is connected to the sense amplifier activating signal line NSA.

When the potential of the latch enabling signal LE is H level, the output of the inverter 34 becomes H level, the PMOS transistor Tr16 is turned ON, and the potential of the sense amplifier activating signal line PSA becomes the power source voltage Vint. When the latch enabling signal LE is H level, the NMOS transistor Tr17 is turned ON, and the potential of the sense amplifier activating signal line NSA becomes the ground potential VSS. Thus, the sense amplifier SA is activated, and the potential difference ΔVBL between the bit lines BL, /BL is amplified by the sense amplifier SA.

On the other hand, when the latch enabling signal LE is L level, the output of the inverter 34 becomes H level, the PMOS transistor Tr16 is turned OFF, the sense amplifier activating signal line PSA becomes floating. When the latch enabling signal LE is L level, the NMOS transistor Tr17 is turned OFF, and the potential of the sense amplifier activating signal line NSA becomes floating. Thus, the sense amplifier SA becomes inactive.

The column switch CSW includes an NMOS transistor Tr18 which connects the bit line BL to the data bus DB, and an NMOS transistor Tr19 which connects the bit line /BL to the data bus line /DB. The gates of the respective NMOS transistors Tr18, Tr19 are connected to the column gate line CL.

In a read operation, signals (read data signals) of the bit lines BL, /BL amplified by the sense amplifier SA are transmitted to the data bus lines DB, /DB via the column switch CSW.

In a write operation, write data signals outputted from the amplifiers 14a, 14b are transmitted to the bit lines BL, /BL via the local data bus line LDB (see FIG. 1), i.e., the data bus lines DB, /DB and column switch CSW, and the information is written in the memory cell MC.

FIG. 5 is the time chart of the operational sequence of the sense amplifier.

The operational sequence will be described by means of the read operation.

First, before the start of the read operation, the precharge control signal line BRS and switch control signal line BT1 are H level. The potentials of both the bit lines BL, /BL are the precharge voltage VPR. The potential of the word line WL connected to a memory cell MC to be selected is L level.

Next, the potential of the precharge control signal lines BRS is changed from H level to L level. When the potential of the precharge control signal lines BRS is L level, the respective NMOS transistors Tr6-Tr11 of the precharge circuits PRE1, PRE2 are turned OFF, and the clamp of the bit lines BL, /BL is released, and the reset of the sense amplifier SA is released.

Then, the potential of the switch control signal lines BT1 connected to the gates of the NMOS transistors Tr2, Tr3 is changed from H level to L level. When the potential of the switch control signal line BT1 is L level, the NMOS transistors Tr2, Tr3 are turned OFF. When the NMOS transistors Tr2, Tr3 become OFF, the bit lines BL, /BL positioned on the left side of the drawing of FIG. 4 are electrically disconnected from the sense amplifier SA. In other words, when the NMOS transistors Tr2, Tr3 are turned OFF, the connection of the non-selected bit lines BL, /BL is released.

Then, the potential of the word line WL connected to a memory cell MC to be selected is changed from L level to H level. That is, the word line WL connected to the memory cell MC to be selected is activated. Then, the transfer transistor Tr1 is turned ON, and the potential difference ΔVB is generated between the bit lines BL, /BL corresponding to a charge stored in the capacitor C1.

Next, the potential of the latch enabling signal line LE is changed from L level to H level. Then, the potential of the sense amplifier activation signal line PSA becomes the power source voltage Vint, and the potential of the sense amplifier activation signal line NSA becomes the ground potential VSS. Thus, the sense amplifier SA is activated, and the potential difference ΔVBL between the bit line BL and the bit line /BL is amplified by the sense amplifier SA.

Next, the potential of the column gate line CL is changed from L level to H level. Then, the NMOS transistors Tr18, Tr19 are turned ON, and the signals of the bit lines BL, /BL amplified by the sense amplifier SA are transmitted to the amplifiers 14a, 14b via the data bus lines DB, /DB. The signals amplified by the amplifiers 14a, 14b are read outside via the data input/output units 16a, 16b.

When the read is completed, the potential of the column gate line CL is changed from H level to L level. Thus, the transistors Tr18, Tr 19 are turned OFF.

Next, the re-write of the information which has been written in the memory cell MC is made. The amplifiers 14a, 14b transmit write signals to the bit lines BL, /BL via the data bus lines DB, /DB and changes the word line WL from H level to L level. Thus, the transfer transistor Tr1 is turned OFF, the selection of the memory cell MC is released, and the information is retained in the memory cell MC.

Next, the potential of the latch enabling signal line LE is changed from H level to L level. Thus, the sense amplifier SA is unactivated.

Next, the potential of the precharge control signal lines BRS is changed from L level to H level. When the potential of the precharge control signal lines BRS is H level, the respective NMOS transistors Tr6-Tr11 of the precharge circuits PRE1, PRE2 are turned ON. Then, the potential of the bit lines BL, /BL is clamped by the precharge voltage VPR.

The potential of the switch control signal line BT1 is changed from L level to H level. When the potential of the switch control signal BT1 is H level, the NMOS transistors Tr2, Tr3 are turned ON, and the bit lines BL, /BL positioned on the left side of the drawing of FIG. 4 are electrically connected to the sense amplifier SA. In other words, when the NMOS transistors Tr2, Tr3 are turned ON, the non-selected bit lines BL, /BL are electrically connected to the sense amplifier SA.

Next, the arbitration circuit 26 will be described. FIGS. 6A, 6B, 7A and 7B are circuit diagrams of the arbitration circuit of the semiconductor memory device according to the present embodiment.

Figure 6A:
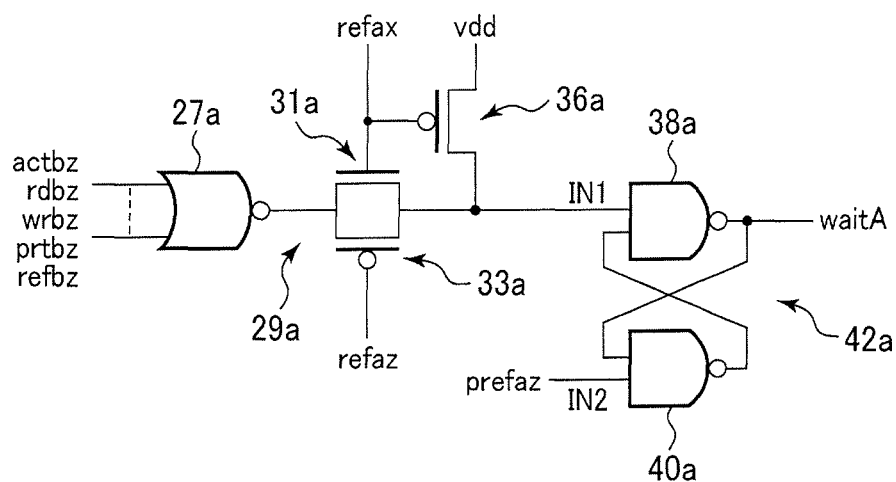
FIGS. 6A, 6B, 7A, and 7B are circuit diagrams of an arbitration circuit of the semiconductor memory device according to the embodiment.
Figure 6B:
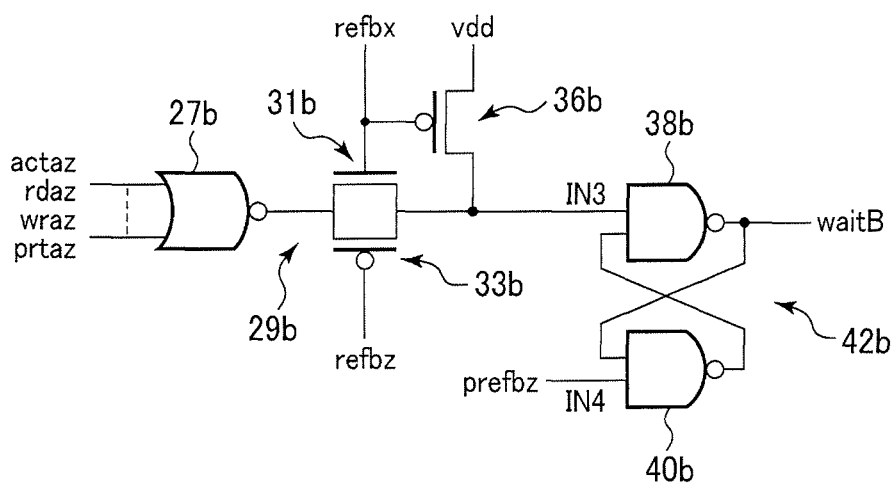

As illustrated in FIGS. 6A and 6B, signal lines actbz, rdbz, wrbz, prtbz, refbz are respectively connected to the input terminals of an NOR gate (logic gate) 27a. These signals actbz, rdbz, wrbz, prtbz, refbz are of internal commands (Int. CMDB) outputted from the command decoder 22b of Channel B. The signal actbz is outputted at H level from the command decoder 22b of Channel B when an active command is inputted to Channel B. The signal rdbz is outputted at H level from the command decoder 22b of Channel B when a read command is inputted to Channel B. The signal wrbz is outputted at H level from the command decoder 22b of Channel B when a write command is inputted to Channel B. The signal prtbz is outputted at H level from the command decoder 22b of Channel B when a precharge command is inputted to Channel B. The signal refbz is outputted at H level from the command decoder 22b of Channel B when a refresh command is generated by the refresh control circuit 18b of Channel B. The output of the NOR gate 27a becomes L level when either of the input signals actbz, rdbz, wrbz, prtbz, refbz is H level.

The output of the NOR gate 27a is inputted to the input terminal of the transfer gate 29a. The transfer gate 29a is formed by a CMOS analog switch. The CMOS analog switch is formed by an NMOS transistor 31a and a PMOS transistor 33a parallelly connected. The transfer gate 29a is turned ON when a signal refax inputted to the gate of the NMOS transistor 31a is H level, and the signal refaz inputted to the gate of the PMOS transistor 33a is L level. On the other hand, the transfer gate 29a is turned OFF when a signal refax inputted to the gate of the NMOS transistor 31a is L level, or a signal refaz inputted to the gate of the PMOS transistor 33a is H level. The signal refaz is outputted at H level from the command decoder 22a when a refresh command is generated by the refresh control circuit 18a of Channel A. The signal refax is generated by inverting the signal refaz by an inverter 35a (see FIG. 7A). The transition timing of the signal refax, which is generated by inverting the signal refaz by the inverter 35a, is delayed from the transition timing of the signal refaz.

Figure 7A:
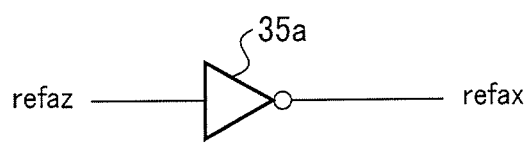

In FIG. 7A, one inverter 35a is illustrated, but the number of the inverter 35a is not limited to one. The delay, i.e., the delay time of the transition timing of the signal refax from the transition timing of the signal refaz can be adjusted by suitably setting the number of the inverters 35a serially connected. The number of the serially connected inverters 35a is, e.g., an odd number. The number of the serially connected inverters 35a is so set that a required delay time can be obtained.

To the output line of the transmission gate 29a, the drain of a PMOS transistor 36a is connected. The source of the PMOS transistor 36a is connected to the power source voltage VDD. The gate of the PMOS transistor 36a is connected to the signal line refax. When the potential of the signal refax is L level, the PMOS transistor 36a is turned ON, and the potential of the output line of the transmission gate 29a becomes H level. On the other hand, when the potential of the signal line refax is H level, the PMOS transistor 36a is turned OFF.

The output line of the transmission gate 29a is connected to one input terminal IN1 of a flip-flop circuit 42a formed by the combination of NAND gates 38a, 40a. To the other input terminal IN2 of the flip-flop circuit 42a, a signal line prefaz is connected. The signal prefaz is outputted at H level from the refresh control circuit 18a when a refresh command is generated by the refresh control circuit 19a of Channel A. After the signal prefaz is outputted from the refresh control circuit 18a to the command decoder 22a, the signal refaz is outputted from the command decoder 22a. Because of a delay in the command decoder 22a, the transition timing of the signal prefaz is earlier than the transition timing of the signal refaz.

The signal lines actaz, rdaz, wraz, prtaz are connected to the input terminal of a NOR gate (logic gate) 26b. These signals actaz, rdaz, wraz, prtaz are of internal command (Int. CMDA) outputted from the command decoder 22a of Channel A. The signal actaz is outputted at H level from the command decoder 22a of Channel A when an active command is inputted to Channel A. The signal rdaz is outputted at H level from the command decoder 22a of Channel A when a read command is inputted to Channel A. The signal wraz is outputted at H level from the command decoder 22a of Channel A when a write command is inputted to Channel A. The signal prtaz is outputted at H level from the command decoder 22a of Channel A when a precharge command is inputted to Channel A. The output of the NOR gate 27b becomes L level when either of the input signals actaz, rdaz, wraz, prtaz is H level.

The output of the NOR gate 27b is inputted to the input terminal of a transfer gate 29b. The transfer gate 29b is formed by a CMOS analog switch. The CMOS analog switch is formed by an NMOS transistor 31b and a PMOS transistor 33b parallelly connected. The transfer gate 29b is turned ON when a signal refbx inputted to the gate of the NMOS transistor 31b is H level and the a signal refbz inputted to the gate of the PMOS transistor 33b is L level. On the other hand, the transfer gate 29b is turned OFF when a signal refbx inputted to the gate of the NMOS transistor 31b is L level, or a signal refbz inputted to the gate of the PMOS transistor 33b is H level. The signal refbz is putted at H level from the command decoder 22b when a refresh command is generated by the refresh control circuit 18b of Channel B. The signal refbx is generated by inverting the signal refbz by an inverter 35b (see FIG. 7B). The transition timing of the signal refbx, which is generate by inverting the signal refbz by the inverter 35b, delays from the transition timing of the signal refbz.

Figure 7B:
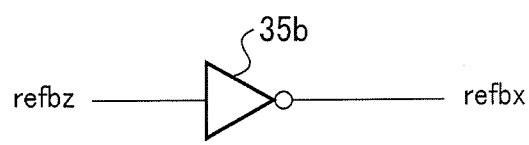

In FIG. 7B, one inverter 35b is illustrated, but the number of the inverter 35b is not limited to one. The delay of the transition timing of the signal refbx from the transition timing of the signal refbz, i.e., the delay time can be adjusted by suitably setting the number of inverters 35b serially connected. The number of the serially connected inverters 35b is, e.g., an odd number. The number of the serially connected inverters 35b is so set that a required delay time can be obtained.

To the output line of the transfer gate 29b, the drain of a PMOS transistor 36b is connected. The source of the PMOS transistor 36b is connected to the source voltage VDD. The gate of the PMOS transistor 36b is connected to the signal refbx. When the potential of the signal line refbx is L level, the PMOS transistor 36b is turned ON, and the potential of the output line of the transfer gate 29b becomes H level. On the other hand, when the potential of the signal line refbx is H level, the PMOS transistor 36b is turned OFF.

The output line of the transfer gate 29b is connected to one input terminal IN3 of a flip-flop circuit 42b formed by NAND gates 38b, 40b combined. To the other input terminal IN4 of the flip-flop circuit 42b, a signal line prefbz is connected. The signal prefbz is outputted at H level from the refresh control circuit 18b when a refresh command is generated by the refresh control circuit 18b of Channel B. After the signal prefbz has been outputted from the refresh control circuit 18b to the command decoder 22b, a signal refbz is outputted from the command decoder 22b. Because of the delay in the command decoder 22b, the transition timing of the signal prefbz is earlier than the transition timing of the signal refbz.

Next, the operation of the arbitration circuit 26 will be described.

First, the operation of the arbitration circuit 26 at the time when a refresh command for Channel A, and either of an active command, a read command, a write command and a precharge command for Channel B overlap each other will be described.

The command decoders 22a, 22b and the arbitration circuit 26 are clock-synchronized, but the refresh control circuit 18a, 18b are not clock-synchronized with the command decoders 22a, 22b and the arbitration circuit 26. Because of the signal delay caused in the command decoders 22a, 22b, the output signal prefaz of the refresh control circuit 18a of Channel A transits to H level earlier than the timing that the output signal refaz from the command decoder 22a transits to H level. The output signal prefaz of the refresh control circuit 18a becomes H level, whereby the input terminal IN2 of the flip-flop circuit 42a is set H level.

Next, a refresh command for Channel A, and either of an active command, a read command, a write command and a precharge command for Channel B are outputted and overlapped. From the command decoder 22a of Channel A, a signal refaz corresponding to the refresh command is outputted at H level. A signal acthz, rdbz, wrbz, prtbz corresponding to either of the active command, the read command, the write command and the precharge command is outputted at H level from the command decoder 22b of Channel B. The timing of the transition of the signal refax is later than the timing of the transition of the signal refaz, and on this stage, the transfer gate 29a is open. Accordingly, the output of L level of the NOR gate 27a arrives at the input terminal IN1 of the flip-flop circuit 42a via the transfer gate 29a. Accordingly, the output signal waitA from the flip-flop circuit 42a is outputted at H level.

The output signal waitA of the flip-flop circuit 42a is a signal (delay signal) for delaying the timing of the control of the memory CORE1 of Channel A. When the delay signal waitA is inputted to the control circuit 24a of Channel A, the control of the memory core CORE1 by the control circuit 24a of Channel A is delayed as will be described later. Thus, the timing that a peak current flows in the refresh for Channel A, and the timing that the micro-signals are processed in Channel B does not overlap, whereby the erroneous operation can be prevented.

After the delay signal waitA of H level has been outputted from the flip-flop circuit 42a, the signal refax transits to L level, and the transfer gate 29a is closed. When the signal refax becomes L level, the PMOS transistor 31a is turned ON, whereby the output of the transfer gate 29a becomes H level, and the inputs to the flip-flop circuit 42a both become H level. The potentials of the input terminals IN1, IN2 of the flip-flop circuit 42a are both H level, whereby the output of the flip-flop circuit 42 is retained, and the delay signal waitA is retained at H level.

Then, when the refresh for Channel A has been completed, the signal prefaz becomes L level. The potential of one input terminal IN2 of the flip-flop circuit 42a is H level, and the potential of the other input terminal INT1 of the flip-flop circuit 42a is L level, whereby the delay signal waitA becomes L level. That is, the delay signal waitA is reset.

Next, the operation of the arbitration circuit 26 at the time that either of an active command, a read command, a write command and a precharge command for Channel A, and a refresh command for Channel B overlap will be described.

As described above, the command decoders 22a, 22b and the arbitration circuit 26 are clock-synchronized, but the refresh control circuit 18a, 18b are not clock-synchronized with the command decoders 22a, 22b and the arbitration circuit 26. Because of the delay caused in the command decoder 22b, the output signal prefbz of the refresh control circuit 18b of Channel B transits to H level earlier than the timing of the output signal refbz of the command decoder 22b transiting to H level. The output signal prefbz of the refresh control circuit 18b becomes H level, whereby the potential of the input terminal IN4 of the flip-flop circuit 42b is set H level.

Then, a refresh command for Channel B, and either of an active command, a read command, a write command and a precharge command for Channel A are outputted and overlapped. A signal refbz corresponding to the refresh command is outputted at H level from the command decoder 22b of Channel B. A signal actaz, rdaz, wraz, prtaz corresponding to either of the active command, the read command, the write command and the precharge command is outputted at H level from the command decoder 22a of Channel A. The timing of transition of the signal refbx is later than the timing of the transition of the signal refbz, and on this stage, the transfer gate 29b is opened. Thus, the output of L level of the NOR gate 27b arrives at the input terminal IN3 of the flip-flop circuit 42b via the transfer gate 29b. Accordingly, the output signal waitB of the flip-flop circuit 42b becomes H level.

The output signal waitB of the flip-flop circuit 42b is a delay signal for the timing of the control of the memory core CORE2 of Channel B being delayed. When the delay signal waitB is inputted to the control circuit 24b of Channel B, the control of the memory core CORE2 by the control circuit 24b of Channel E is delayed as will be described alter.

After the delay signal waitB has been outputted at H level, the signal refbx transit to L level, and the transfer gate 29b is closed. When the signal refbx becomes L level, the PMOS transistor 36b is turned ON, and accordingly, the output of the transfer gate 29b becomes H level, and the input terminals IN3, IN4 of the flip flop circuit 42b both become H level. Both the input terminals IN3, IN4 of the flip-flop circuit 42b are H level, whereby the output of the flip-flop circuit 42b is retained and is retained at H level.

Then, when the refresh of the channel B has been completed, the signal prefbz become L level. The potential of the input terminal IN3 of the flip-flop circuit 42b is H level, and the potential of the input terminal IN4 of the flip-flop circuit 42b is L level, whereby the delay signal waitB becomes L level. That is, the delay signal waitB is reset.

Next, the operation of the arbitration circuit 26 at the time that a refresh command for Channel A, and a refresh command for Channel B are overlapped will be described.

As described above, the command decoders 22a, 22b and the arbitration circuit 26 are clock-synchronized, but the refresh control circuit 18a, 18b are not clock-synchronized with the command decoders 22a, 22b and the arbitration circuit 26. Because of the delay in the command decoder 22a, the output signal prefaz of the refresh control circuit 1ea of Channel A transits to H level earlier than the timing of the transition of the output signal refaz from the command decoder 22a to H level. The output signal prefaz of the refresh control circuit 22a becomes H level, whereby the potential of the input terminal IN2 of the flip-flop circuit 42a is set H level.

Because of the delay in the command decoder 22b, the output signal prefbz of the refresh circuit 18b of Channel B transits to H level earlier than the timing of the transition of the output signal refbz from the command decoder 22b to H level. The output signal prefbz of the refresh control circuit 18b become H level, whereby the input terminal IN4 of the flip-flop circuit 42b is set H level.

Next, a refresh command for Channel A, and a refresh command for Channel B are outputted and overlapped. A signal refaz corresponding to the refresh command is outputted at H level from the command decoder 22a of Channel A. From the command decoder 22b of Channel B, a signal refbz corresponding to the refresh command is outputted at H level. The timing of the transition of the signal refax is later than the timing of the transition of the signal refaz, and on this stage, the transfer gate 29a is opened. Accordingly, the output of L level of the NOR gate 27a arrives at the input terminal IN1 of the flip-flop circuit 42a via the transfer gate 29a. Accordingly, the output signal waitA of the flip-flop circuit 42a becomes H level.

The timing of the transition of the signal refbx is later than the timing of the transition of the signal refbz, and on this stage, the transfer gate 29b is opened. Accordingly the output of H level of the NOR gate 27b arrives at the input terminal IN3 of the flip-flop circuit 42b via the transfer gate 29b. The inputs of the flip-flop circuit 42b are both H level, whereby the output of the flip-flop circuit 42b are retained, and the output signal waitB is retained L level.

As described above, the delay of the timing of the transition of the signal refax from the timing of the transition of the signal refaz, i.e., the delay time can be adjusted by suitably setting the number of inverters 35a (see FIG. 7A) serially connected. The number of the inverters 35a serially connected is so set that a required delay time can be obtained.

As described above, the delay of the timing of the transition of the signal refbx from the timing of the transition of the signal refbz, i.e., the delay time can be adjusted by suitably setting the number of inverters 35b (see FIG. 7B) serially connected. The number of the inverters 35b serially connected is so set that a required delay time can be obtained.

When the delay signal waitA is inputted to the control circuit 24a of Channel A, the control of the memory core CORE1 by the control circuit 24a of Channel A is delayed as will be described alter. Thus, the timing of a peak current being generated in the refresh for Channel A, and the timing of a peak current being generated in the refresh for Channel B do not overlap. Accordingly, the power source used in the semiconductor memory device according to the present embodiment can be small, which can contribute to decreasing costs, downsizing, etc.

After the delay signal waitA has been outputted at H level, the signal refax transits to L level, and the transfer gate 29a is closed, when the signal refax becomes L level, the PMOS transistor 36a turned ON, whereby the output of the transfer gate 29a becomes H level, and the potentials of the input terminals IN1, IN2 of the flip-flop circuit 42a are both H level. The potentials of the input terminals IN1, IN2 of the flip-flop circuit 42a both become H level, whereby the output of the flip-flop circuit 42a is retained, and the delay signal waitA is retained H level.

Then, when the refresh for Channel A has been completed, the signal prefaz becomes L level. The potential of the input terminal IN1 of the flip-flop circuit 42a is H level, and the potential of the input terminal IN2 of the flip-flop circuit 42a is L level, whereby the delay signal waitA becomes L level. That is, the delay signal waitA is reset.

Next, the operation of the semiconductor memory device according to the present embodiment will be described.

Figure 8:
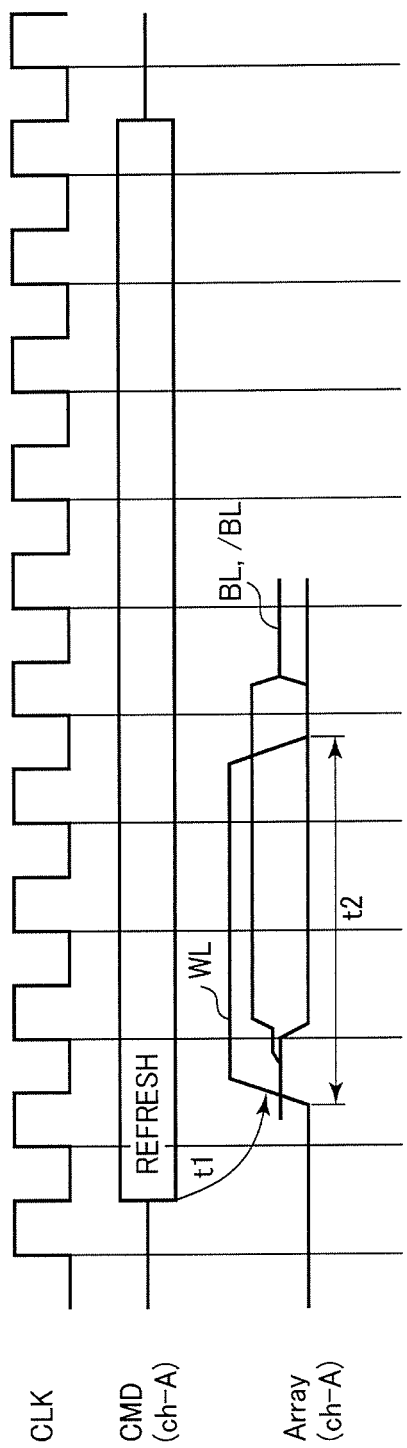
FIG. 8 is a time chart of an operation of a case that a refresh command is generated in Channel A.

First, the case that a command for Channel A and a command for Channel B are not overlapped will be described. The case a refresh command for Channel A will be described here. FIG. 8 is the time chart of the operation of the case that a refresh command (REFRESH) is generated in Channel A. In FIG. 8, "CLK" indicates the clock, "CMD (ch-A)" indicates an internal command (Int. CMDA) for Channel A, and "Array (ch-A)" indicates the operation of the memory cell array 28 of Channel A.

On the stage prior to the output of a refresh command from the command decoder 22a of Channel A, a signal prefaz of H level is outputted from the refresh control circuit 18a of Channel A. Thus, the potential of the input terminal IN2 of the flip-flop circuit 42a becomes H level. Because of the potential of H level of the input terminal IN1 of the flip-flop circuit 42a, the output signal waitA of the flip-flop circuit 42a is retained L level.

Then, the signal refaz outputted from the command decoder 22a of Channel A becomes H level, the signal refax inverted by the inverter 35a becomes L level, and the transmission gate 29a is closed. Since the signal refax becomes L level, the PMOS transistor 36a is turned ON, and the potential of the input terminal IN1 of the flip-flop circuit 42a is retained H level. Since both of the potentials of the input terminals IN1, IN2 of the flip-flop circuit 42a are H level, the delay signal waitA is retained L level. Since the delay signal waitA is L level, the memory core CORE1 of Channel A is controlled by the control circuit 24a without delay. That is, the word line WL is activated after the prescribed period of time t1 has passed from the generation of the refresh command.

The period of time t2 in FIG. 8 is the period of time from the start of the activation of the word line WL to the finish of the activation of the word line WL.

Figure 9:
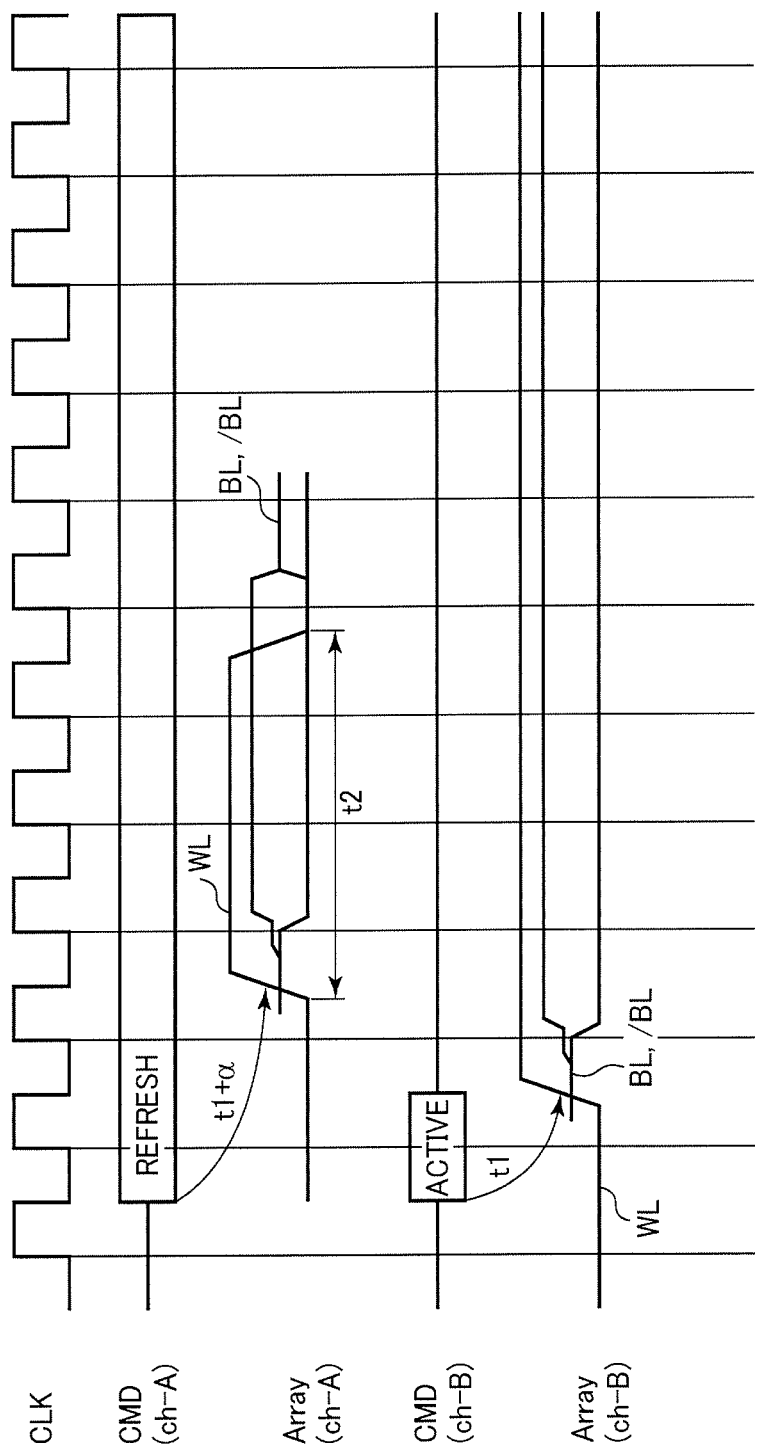
FIG. 9 is a time chart of a case that a refresh command and an active command are overlapped.

Next, the operation of the case that a refresh command and an active command are overlapped will be described with reference to FIG. 9. FIG. 9 is the time chart of the case that a refresh command and an active command are overlapped. The case that the refresh command is generated in Channel A, and the active command is inputted to Channel B will be described here.

On the stage prior to the output of the refresh command from the command decoder 22a of Channel A, a signal prefaz of H level is outputted from the refresh control circuit 18a of Channel A. Thus, the input terminal IN2 of the flip-flop circuit 42a becomes H level. Because of the potential of H level of the input terminal IN1 of the flip-flop circuit 42a, the output signal waitA of the flip-flop circuit 42a is retained L level.

Next, the signal refaz corresponding to the refresh command for Channel A and the signal actbz corresponding to the active command for Channel B are changed from L level to H level. On this stage, because of the signal refax of H level, the transfer gate 29a is not closed, the output of L level of the NOR gate 27a arrives at the input terminal IN1 of the flip-flop circuit 42a, and the output signal waitA of the flip-flop circuit 42a becomes H level. When the delay signal waitA becomes H level, the control circuit 24a of Channel A delays by a prescribed period of time α the start of the execution of the control for the memory core CORE1 of Channel A. That is, the control circuit 24a activates the word line WL after a period of time t1+α has passed from the generation of the refresh command. The period of time α by which the start of the execution of the command is delayed is so set that the selection of the word line WL connected to the memory cell MC of Channel A is started after the signal has been amplified by the sense amplifier 28 of Channel B. For example, the delay period of time α is about 10 nanoseconds here. Because of the delay signal waitB of L level, in Channel B, the memory core CORE2 of Channel B is controlled by the control circuit 24*b* without the delay. In Channel A, since the control of the memory core CORE1 by the control circuit 24*a* is delayed by the period of time α, after the processing of micro-signals is made in Channel B, and then the peak current by the activation of the word line WL is generated in Channel A. That is, after the amplification of the signal by the amplifier 28 in Channel B, the peak current is generated by the activation of the word line WL of Channel A. The large peak current flows in the activation of the word line WL of Channel A, but when the word line WL of Channel A is activated, the amplification of the signal by the amplifier 28 in Channel B has been completed. When the large peak current flows in Channel A, the micro-signals are not processed in Channel B, whereby no erroneous operation due to noises, etc. take place in Channel B, and no special problem takes place.

Figure 10:
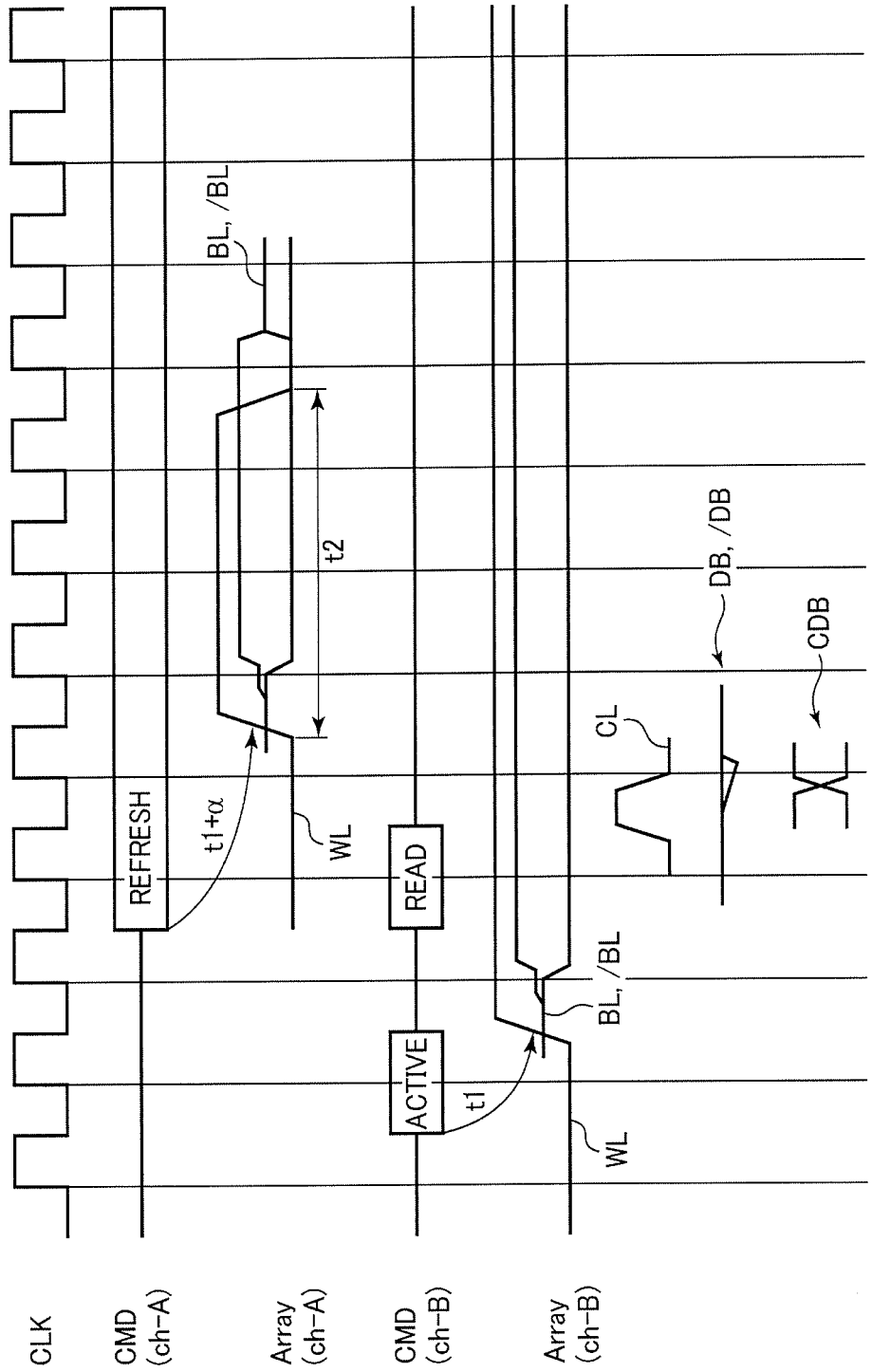
FIG. 10 is a time chart of a case that the refresh command and a read command are overlapped.

Next, the operation in the case that a refresh command and a read command are overlapped will be described. FIG. 10 is the time chart of the case that a refresh command and a read command are overlapped. The case that a refresh command is generated in Channel A, and a read command is inputted to Channel B will be described here.

On the stage prior to the input, of a read command in Channel B, an active command is inputted to Channel B, and the word line WL is activated.

On the stage before the refresh command is outputted from the command decoder 22*a* of Channel A, a signal prefaz of H level is outputted from the refresh control circuit 18*a* of Channel A. Thus, the input terminal IN2 of the flip-flop circuit 42*a* becomes H level. The input terminal IN1 of the flip-flop circuit 42*a* is H level, whereby the output signal waitA of the flip-flop circuit 42*a* is retained L level.

Then, the refresh command is outputted from the command decoder 22*a* of Channel A, and the read command is outputted from the command decoder 22*b* of Channel B. That is, the signal refaz of H level outputted from the command decoder 22*a* of Channel A and the signal rdbz of H level outputted from the command decoder 22*b* of Channel B are overlapped. On this stage, the signal refax is H level, whereby the transfer gate 29*a* is not closed, the output of L level of the NOR gate 27*a* arrives at the input terminal IN1 of the flip-flop circuit 42*a*, and the output signal waitA of the flip-flop circuit 42*a* become H level. When the delay signal waitA becomes H level, the start of the execution of controlling the memory core CORE1 of Channel A is delayed by the prescribed period of time α. That is, the control circuit 24*a* activates the word line WL of the memory core CORE1 of Channel A after the period of time t1+α has passed from the generation of the refresh command. The period of time α by which the start of the execution of the command is delayed is so set that the selection of the word line WL connected to the memory cell MC of the memory core CORE1 of Channel A is started after the read of the signal of the data bus lines DB, /DB amplified by the sense amplifier 28 has been completed in Channel B. For example, the delay period of time α is about 5 nanoseconds here. On the other hand, because of the delay signal waitB of L level, in Channel B, the memory core CORE2 of Channel B is controlled by the control circuit 24*b* without delay.

The NMOS transistors Tr18, Tr19 are turned ON with the potential of the column gate line CL of Channel B set H level, micro-signals are generated between the data bus lines DB, /DB. Then, the micro-signals between the data bus lines DB, /DB are amplified by the amplifier 28, and the data are read outside via the common data bus CDB and the input/output control units 16*a*, 16*b*. Then, the column gate CL is changed to L level, whereby the read is completed. The control of the memory core CORE1 by the control circuit 24*a* is delayed by the period of time α in Channel A, whereby the peak current due to the activation of the word line WL is generated in Channel A after the read of the micero-signals of the data bus lines DB, /DB has been completed in Channel B. The large peak current flows when the word line WL of the memory core CORE1 of Channel A is activated, but the amplification of the micro-signals between the data bus lines DB, /DB has been completed in Channel B. When the large peak current flows in Channel A, the processing of the micro-signals is not made in Channel B, whereby no erroneous operation due to noises, etc. takes place in Channel B, and no special problem takes place.

Next, the operation of the case that a refresh command and a write command are overlapped will be described. FIG. 11 is the time chart of the case that a refresh command and a write command are overlapped. The case that the refresh command is generated in Channel A, and the write command is inputted to Channel B will be described here.

On the stage prior to the input, of the write command to Channel B, an active command is inputted to Channel B, and the word line WL is activated.

On the stage prior to the output of the refresh command from the command decoder 22*a* of Channel A, the signal prefaz of H level is outputted from the refresh control circuit 18*a* of Channel A. Thus, the input terminal IN2 of the flip-flop circuit 42*a* becomes H level. Because of the input terminal IN1 of H level of the flip-flop circuit 42*a*, the output of the flip-flop circuit 42*a* is retained L level.

Next, the refresh command is outputted from the command decoder 22*a* of Channel A, the write command is outputted from the command decoder 22*b* of Channel B. That is, the signal refaz of H level outputted from the command decoder 22*a* of Channel A and the signal wrbz of H level outputted from the command decoder 22*b* of Channel B are overlapped. On this stage, the signal refax is H level, whereby the transfer gate 29*a* is not closed, the output of L level of the NOR gate 27*a* arrives at the input terminal IN1 of the flip-flop circuit 42*a*, and the output signal waitA of the flip-flop circuit 42*a* becomes H level. When the delay signal waitA becomes H level, the control circuit 24*a* of Channel A delays by the prescribed period of time α the start of the execution of the control of the memory core CORE1 of Channel A. That is, the control circuit 24*a* activates the word line WL of Channel A after the period of time t1+α has passed from the generation of the refresh command. The period of time α by which the start of the execution of the command is so set that the selection of the word line WL connected to the memory cell MC of Channel A is started after the transfer of the signals from the data bus lines DB, /DB to the bit lines BL, /BL connected to the memory cell MC of Channel B. For example, the delay period of time u is about 7 nanoseconds here. On the other hand, the delay signal waitB is L level, whereby in Channel B, the memory core CORE2 of Channel B is controlled without delay by the control circuit 24*b*.

The write signal amplified by the amplifier 28 is set between the data bus lines DB, /DB of Channel B. Then, the potential of the column gate line CL is changed from L level to H level to turn ON the NMOS transistors Tr18, Tr19, and the write signal is transferred between the bit lines BL, /BL. In the inversion of the latch circuit formed by the inverters INV1, INV2, the latch circuit does not always quickly invert, which may micronize the signal at parts. Then, the potential of the column gate line CL is changed from H level to L level, whereby the column switch CSW is closed.

The control of the memory core CORE1 by the control circuit 24a in Channel A is delayed by the period of time α, whereby the word line WL is activated in Channel A after the signal has been transmitted to the bit lines BL, /BL via the data bus lines DB, /DB. When the word line WL is activated in Channel A, the large peak current is generated, but the transmission of the signal from the data bus lines DB, /DB to the bit lines BL, /BL has been already completed. When the large peak current is generated in Channel A, the micro-signals are not processed in Channel B, whereby no erroneous operation due to noises, etc. takes place in Channel B, and no special problem takes place.

Then, the operation of the case that a refresh command and a refresh command are overlapped will be described with reference to FIG. 12. FIG. 12 is the time chart of the case that refresh commands are overlapped. The case that a refresh command is generated in Channel A, and also in Channel B, a refresh command is generated will be described.

On the stage prior to the output of a refresh command from the command decoder 22a of Channel A, the signal prefaz of H level is outputted from the refresh control circuit 18a of Channel A. Thus, the input terminal IN2 of the flip-flop circuit 42a becomes H level. Because of the input terminal IN1 of H level of the flip-flop circuit 42a, the output signal waitA of the flip-flop circuit 42a is retained L level.

On the stage prior to the output of the refresh command from the command decoder 22a of Channel A, the signal prefbz of H level is outputted from the refresh control circuit 18b of Channel B. Thus, the input terminal IN4 of the flip-flop circuit 42b becomes H level. Because of the potential of H level of the input terminal IN3 of the flip-flop circuit 42b, the output signal waitB of the flip-flop circuit 42b is retained L level.

Next, the signal refaz corresponding to the refresh command for Channel A and the signal refbz corresponding to the refresh command for Channel B are changed from L level to H level. On this stage, since the signal refax is H level, the transfer gate 29a is not closed, the output of L level of the NOR gate 27a arrives at the input terminal IN1 of the flip-flop circuit 42a, and the output signal waitA of the flip-flop circuit 42a becomes H level. When the delay signal waitA becomes H level, the control circuit 24a of Channel A delays by the prescribed period of time α the start of the executing the control of memory core CORE1 of Channel A. That is, the control circuit 24a of Channel A activates the word line WL after the period of time t1+α has passed from the generation of the refresh command. The period of time α is so set that the start of the selection of the word line WL connected to the memory cell MC of Channel A is started after the amplification of the signal by the sense amplifier 28 of Channel B has been completed. For example, the period of time α is about 10 nanoseconds here. On the other hand because of the delay signal waitB of L level, in Channel B, the memory core CORE2 of Channel B is controlled by the control circuit 24b without delay. Since the control of the memory core CORE1 by the control circuit 24a in Channel A is delayed by the period of time α, whereby the peak current due to the activation of the word line WL is generated in Channel A after the micro-signals have been processed in Channel B. That is, after the signal has been amplified by the sense amplifier 23 in Channel B, the peak current due to the activation of the word line WL is generated in Channel A. The large peak current flows when the word line WL of Channel A is activated, but when the word line WL of Channel A is activated, the amplification of the signal by the sense amplifier 28 has been completed in Channel B. The micro-signals are not processed in Channel B when the large peak current flows in Channel A, whereby no erroneous operation due to noises, etc. takes place in Channel B, and no special problem takes place.

Modified Embodiments

The present invention is not limited to the above-described embodiment and can cover other various modifications.

For example, in the above-described embodiment, when a refresh command for Channel A and a refresh command for Channel B are overlapped, the control of the memory core CORE1 of Channel A is delayed, but this is not essential. For example, the control of the memory core CORE2 of Channel B may be delayed.

In the above-described embodiment, the description has been made by means of the example of two channels, Channel A and Channel B, but the number of the channels is not limited to two. The present invention is applicable to any case including a plurality of the channels.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory device comprising:
   a plurality of input/output ports;
   a plurality of memory blocks provided respectively corresponding to the plurality of input/output ports, the plurality of memory blocks each comprising a memory core having a memory cell array including a plurality of memory cells; a first command generating circuit which generates a first command; a command decoder which outputs a third command, based on the first command or based on a second command inputted via an input/output port of the plurality of input/output ports, and a control circuit which controls the memory core based on the third command; and
   an arbitration circuit which outputs a delay signal to the control circuit of one memory block of the plurality of memory blocks, the delay signal which delays a start of an execution of the third command based on the first command, in a first case when the third command, which is outputted from the command decoder of the one memory block based on the first command, and the third command, which is outputted from the command decoder of another memory bock of the plurality of memory blocks based on the second command, are overlapped.

2. The semiconductor memory device according to claim 1, wherein
   the arbitration circuit outputs the delay signal to the control circuit of the one memory block or the control circuit of the another memory block, in a second case when the third command, which is outputted from the command decoder of the one memory block based on the first command, and the third command, which is outputted from the command decoder of the another memory block based on the first command, are overlapped.

3. The semiconductor memory device according to claim 1, wherein the memory cell is a dynamic type memory cell, and
the first command is a refresh command.

4. The semiconductor memory device according to claim 3, wherein the memory core further includes a sense amplifier which amplifies a signal corresponding to data stored in the memory cell,
the second command is an active command, and
the arbitration circuit outputs the delay signal to the control circuit of the one memory block in the first case so that a selection of a word line connected to the memory cell of the one memory block is started after an amplification of the signal by the sense amplifier of the another memory block has been completed.

5. The semiconductor memory device according to claim 3, wherein the memory core further includes a sense amplifier which amplifies a signal corresponding to data stored in the memory cell,
the second command is a read command, and
the arbitration circuit outputs the delay signal to the control circuit of the one memory block in the first case so that a selection of a word line connected to the memory cell of the one memory block is started after a read of a signal amplified by the sense amplifier of the another memory block via a data bus line has been completed.

6. The semiconductor memory device according to claim 3, wherein the memory core further includes a sense amplifier which amplifies a signal corresponding to data stored in the memory cell,
the second command is a write command, and
the arbitration circuit outputs the delay signal to the control circuit of the one memory block in the first case so that a selection of a word line connected to the memory cell of the one memory block is started after a transmission of a signal from a data line to a bit line connected to the memory cell of the another memory block has been completed.

7. The semiconductor memory device according to claim 2, wherein the memory core further includes a sense amplifier which amplifies a signal corresponding to data stored in the memory cell, and
the arbitration circuit outputs the delay signal to the control circuit of the another memory block in the second case so that a selection of a word line connected to the memory cell of the another memory block is started after an amplification of the signal by the sense amplifier of the one memory block has been completed.

* * * * *

UNITED STATES PATENT AND TRADEMARK OFFICE
CERTIFICATE OF CORRECTION

PATENT NO. : 9,053,757 B2  
APPLICATION NO. : 14/024016  
DATED : June 9, 2015  
INVENTOR(S) : Shinya Fujioka Page 1 of 1

It is certified that error appears in the above-identified patent and that said Letters Patent is hereby corrected as shown below:

On the Title page, item (54), and in the Specification, column 1,

Title reads:

SEMICONDUCTOR MEMORY DEVICE COMPRISING A ~~PLURITY~~ OF INPUT/OUTPUT PORTS AND A ~~PLURITY~~ OF MEMORY BLOCKS CORRESPONDING TO THE PLURALITY OF INPUT/OUTPUT PORTS

Title should read:

SEMICONDUCTOR MEMORY DEVICE COMPRISING A <u>PLURALITY</u> OF INPUT/OUTPUT PORTS AND A <u>PLURALITY</u> OF MEMORY BLOCKS CORRESPONDING TO THE PLURALITY OF INPUT/OUTPUT PORTS

Signed and Sealed this  
Thirteenth Day of October, 2015

Michelle K. Lee  
*Director of the United States Patent and Trademark Office*